(12) United States Patent
Zhang et al.

(10) Patent No.: US 12,002,509 B2
(45) Date of Patent: Jun. 4, 2024

(54) DATA READOUT CIRCUIT OF RESISTIVE RANDOM ACCESS MEMORY AND RESISTIVE RANDOM ACCESS MEMORY CIRCUIT

(71) Applicant: INSTITUTE OF MICROELECTRONICS OF THE CHINESE ACADEMY OF SCIENCES, Beijing (CN)

(72) Inventors: Feng Zhang, Beijing (CN); Qirui Ren, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/756,315

(22) PCT Filed: Jul. 2, 2021

(86) PCT No.: PCT/CN2021/104170
§ 371 (c)(1),
(2) Date: May 22, 2022

(87) PCT Pub. No.: WO2022/222274
PCT Pub. Date: Oct. 27, 2022

(65) Prior Publication Data
US 2024/0153554 A1     May 9, 2024

(30) Foreign Application Priority Data

Apr. 23, 2021   (CN) .......................... 202110440000.3

(51) Int. Cl.
*G11C 11/16*     (2006.01)
*G11C 7/02*      (2006.01)
(Continued)

(52) U.S. Cl.
CPC ........ *G11C 13/004* (2013.01); *G11C 13/0059* (2013.01); *G11C 2013/0045* (2013.01)

(58) Field of Classification Search
CPC .............. G11C 13/004; G11C 13/0059; G11C 2013/0045; G11C 11/1673;
(Continued)

(56) References Cited

U.S. PATENT DOCUMENTS 7,821,859 B1 * 10/2010 Raghavan .............. G11C 7/062
365/207
2007/0140029 A1 * 6/2007 Kim ....................... G11C 7/067
365/233.12

(Continued)

*Primary Examiner* — Ly D Pham
(74) *Attorney, Agent, or Firm* — Syncoda LLC; Feng Ma

(57) ABSTRACT

A data readout circuit of a RRAM includes: an adaptive current sense amplifier (CSA) and a reference current generator, the adaptive CSA is configured to electrically connect to the RRAM, and the adaptive CSA is electrically connected to the reference current generator; the reference current generator is configured to generate a basic reference current; the adaptive CSA is configured to obtain a reference current according to the basic reference current and a bit-line current of the RRAM; and the adaptive CSA is configured to compare the size of the reference current and that of the bit-line current so as to read out stored data. The present disclosure can improve the problem of data readout error due to the degradation of high resistance state of the RRAM.

9 Claims, 5 Drawing Sheets

(51) Int. Cl.
  *G11C 7/06* (2006.01)
  *G11C 11/15* (2006.01)
  *G11C 13/00* (2006.01)

(58) Field of Classification Search
  CPC ........ G11C 2013/0054; G11C 11/5607; G11C 2207/063; G11C 29/021
  USPC .......................................................... 365/148
  See application file for complete search history.

(56) References Cited

U.S. PATENT DOCUMENTS

| | | | |
|---|---|---|---|
| 2016/0027485 A1* | 1/2016 | Park | G11C 11/5642 365/189.011 |
| 2016/0035417 A1* | 2/2016 | Park | G11C 11/1659 365/148 |
| 2016/0099049 A1* | 4/2016 | Lee | G11C 13/0064 365/148 |
| 2016/0125939 A1* | 5/2016 | Park | G11C 11/5678 365/148 |
| 2016/0148678 A1* | 5/2016 | Park | G11C 13/004 365/148 |
| 2017/0221538 A1* | 8/2017 | Kim | G11C 11/1675 |
| 2018/0151211 A1* | 5/2018 | Lee | G11C 7/062 |
| 2019/0156909 A1  | 5/2019 | Lee | G11C 8/10 |
| 2019/0348096 A1* | 11/2019 | Antonyan | G11C 13/0026 |
| 2019/0385656 A1* | 12/2019 | Lee | G11C 11/1657 |

* cited by examiner

DATA READOUT CIRCUIT OF RESISTIVE RANDOM ACCESS MEMORY AND RESISTIVE RANDOM ACCESS MEMORY CIRCUIT

CROSS-REFERENCE TO RELATED APPLICATIONS

This application is a national stage of International Application No. PCT/CN2021/104170 filed on Jul. 2, 2021, which claims priority to Chinese Patent Application No. 202110440000.3 filed on Apr. 23, 2021. The disclosures of these applications are hereby incorporated by reference in their entirety.

TECHNICAL FIELD

The present disclosure relates to the technical field of circuits, in particular to a data readout circuit of a resistive random access memory and a resistive random access memory circuit.

BACKGROUND

In recent years, resistive random access memory (RRAM) has become a promising embedded non-volatile memory at advanced process nodes because of its good scalability, low power consumption and good compatibility with logic process technology, and has been widely used in consumer electronics, autonomous vehicles, industrial control, and IoT (Internet of Things) edge devices and so on.

However, with the use of a RRAM, resistance states of the RRAM gradually degrades, that is, the resistance value of the high resistance state of the RRAM decreases significantly or the resistance value of the low resistance state of the RRAM increases significantly, which easily leads to the difficulty of a data readout circuit to distinguish the high resistance state and the low resistance state normally, and thus results in data readout error.

SUMMARY

Embodiments of the present disclosure provide a data readout circuit of a RRAM and a resistive random access memory circuit (RRAM circuit), which can improve the problem of data readout error caused by the degradation of high resistance state of the RRAM.

In a first aspect of the present disclosure, a data readout circuit of a resistive random access memory (RRAM) is provided, comprising: an adaptive current sense amplifier (CSA) and a reference current generator, the adaptive CSA is configured to electrically connect to the RRAM, and the adaptive CSA is electrically connected to the reference current generator; the reference current generator is configured to generate a basic reference current; the adaptive CSA is configured to obtain a reference current based on a bit-line current of the RRAM and the basic reference current; and the adaptive CSA is configured to compare the size of the reference current and that of the bit-line current to read out data stored in the RRAM.

In some embodiment implementations, the adaptive CSA includes: a data readout module and a reference current module; the data readout module is electrically connected to the reference current module, and the data readout module is configured to electrically connect to the RRAM, and the reference current module is electrically connected to the RRAM and the reference current generator, respectively; the reference current module is configured to obtain the reference current based on the basic reference current and the bit-line current; and the data readout module is configured to compare the size of the reference current and that of the bit-line current to read out the stored data.

In some embodiment implementations, the reference current module includes a feedback unit and a plurality of amplifying units; the feedback unit is electrically connected to the RRAM and the amplifying units respectively, and each of the amplifying units is electrically connected to the data readout module and the reference current generator respectively; the feedback unit is configured to generate an challenge response according to the bit-line current of the RRAM, and to control turn-on of a corresponding amplifying unit according to the challenge response; and the amplifying unit is configured to amplify the basic reference current to obtain a corresponding reference current.

In some embodiment implementations, the plurality of amplifying units is connected in parallel, and each of the amplifying units corresponds to an amplification factor.

In some embodiment implementations, each of the amplifying units includes a first MOS transistor, and a gate of the amplifying unit is electrically connected to the feedback unit.

In some embodiment implementations, each of the amplifying units includes a second MOS transistor, and a third MOS transistor is disposed between the second MOS transistor and the reference current generator; a width-to-length ratio of a channel of the third MOS transistor multiplied by the amplification factor is equal to a width-to-length ratio of a channel of a corresponding second MOS transistor.

In some embodiment implementations, the adaptive CSA includes a pre-protection module; the data readout module includes a bit-line current input terminal, a reference current input terminal and a data readout terminal; and the bit-line current input terminal and the reference current input terminal are respectively electrically connected to the pre-protection module.

In some embodiment implementations, the reference current generator includes a replica resistive random access memory (RRAM) module and a current generation module; the current generation module is configured to generate the basic reference current when the replica RRAM module is in a low resistance state, wherein a current when the replica RRAM module is in the low resistance state is a low resistance current which is twice the basic reference current.

In some embodiment implementations, the replica RRAM module includes a plurality of resistive random access memory (RRAM) cells.

In a second aspect of the present disclosure, provided is a RRAM circuit, comprising: a RRAM and the data readout circuit of the RRAM as described in the first aspect; the RRAM includes a resistive random access memory (RRAM) array and a data writing control circuit, RRAM array is electrically connected to the data writing control circuit; the RRAM array is electrically connected to the data readout circuit of the RRAM; and the RRAM array includes a plurality of RRAM cells.

The data readout circuit of the RRAM and RRAM circuit provided by the embodiments of the present disclosure, an adaptive CSA and a reference current generator are disposed, wherein the reference current generator can generate a basic reference current, and the adaptive CSA can adaptively adjust a corresponding reference current according to the size of a bit-line current, the reference current has a linear coefficient relationship with the basic reference current, and by dynamically adjusting the size of the reference current, it can be ensured that the reference current is always in the middle of the bit-line currents output in a high resistance state and that output in a low resistance state so that stored data can still be correctly read out even in the case that the degradation of high resistance state occurs in the RRAM. In this way, the present disclosure may improve accuracy of determining the comparison between the size of the bit-line current IBL and that of the reference current Iref, and thus may avoid the problem of data readout error due to the decrease of the resistive random access memory window (RRAM window) caused by the degradation of resistance states of the RRAM.

DETAILED DESCRIPTION OF THE INVENTION

In order to better understand the technical solutions provided by embodiments of the specification, the technical solutions of the embodiments of the specification will be described in detail below through the accompanying drawings and the specific embodiments. It should be understood that the embodiments of the specification and the specific features in the embodiments are regarded as detailed explanation for the technical solutions of the embodiments of the specification, rather than as a limitation to the technical solutions of the specification, and that the embodiments of the specification and the technical features in the embodiments can be combined with one another in the case of no conflict.

In the context, terms such as "first" and "second" are used only to distinguish one entity or operation from another entity or operation, without necessarily requiring or implying any such actual relationship or order between those entities or operations. Moreover, the wordings "comprise", "include" or any other variation thereof are intended to cover a non-exclusive inclusion so that a process, method, article or device that includes a set of elements includes not only these elements, but also other elements that are not explicitly listed, or elements that are inherent to this process, method, article or device. Without further limitation, for an element defined by the wording "includes an/a . . . " it is not intended to exclude the existence of additional identical elements in the process, method, article or device that includes said element. The wording "more than two" includes two or more than two.

The resistive random access memory (RRAM) has become a more promising embedded non-volatile memory at advanced process nodes due to its good scalability, low power consumption and good compatibility with logic process technology, and has been widely used in consumer electronics, autonomous vehicles, industrial control, and IoT edge devices and so on. However, along with the use of the RRAM, the high resistance state of the RRAM degrades gradually, that is, the resistance value of the RRAM in the high resistance state decreases substantially, which easily causes a data readout circuit hard to distinguish the high resistance state from the low resistance state properly, and thus leads to data readout error.

In view of this, the present disclosure provides a data readout circuit of a RRAM and a resistive random access memory circuit (RRAM circuit), which can solve the problem of data readout error resulted from the degradation of high resistance state of the RRAM.

Figure 1:
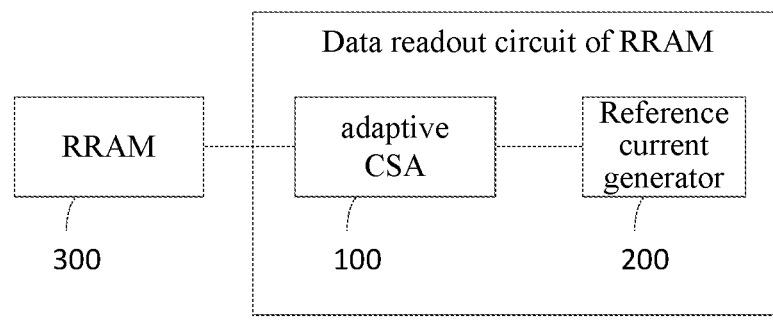
FIG. 1 is a schematic block diagram of a structure of a data readout circuit of a RRAM according to an embodiment of the present disclosure.

In a first aspect of the present disclosure, a data readout circuit of a RRAM is provided. In some embodiments, FIG. 1 is a schematic block diagram of a structure of the data readout circuit of the RRAM according to an embodiment of the present disclosure. Exemplarily, as shown in FIG. 1, the data readout circuit of the RRAM provided by the embodiment of the present disclosure includes: an adaptive current sense amplifier (CSA) 100 and a reference current generator 200. The adaptive CSA 100 is configured to electrically connect to the RRAM 300, and the adaptive CSA 100 is electrically connected to the reference current generator 200. The reference current generator 200 is configured to generate a basic reference current; the adaptive CSA 100 is configured to obtain a reference current based on the basic reference current and a bit-line current of the RRAM 300; and the adaptive CSA 100 is configured to compare the size of the reference current and that of the bit-line current so as to read out data stored in the RRAM.

Exemplarily, incorporating with FIG. 1, the data readout circuit of the RRAM provided by the embodiment of the present disclosure can read the data stored in the RRAM 300. Specifically, the RRAM 300 will generate a bit-line current IBL during operation. The bit-line current IBL is a current flowing through the RRAM. The data readout circuit of the RRAM may read out the data stored in the RRAM 300 by comparing the size of the bit-line current IBL and the size of a reference current Iref generated by itself. Exemplarily, if IBL>Iref, then an output of the data readout circuit of the RRAM is "1", and if IBL<Iref, the output of the data readout of the RRAM is "0". Exemplarily, when the RRAM 300 is in a high resistance state, and the bit-line current IBL is relatively lower, then the output of the data readout circuit of the RRAM is "0"; and when the RRAM 300 is in a low resistance state, and the bit-line current IBL is relatively larger, then the output of the data readout circuit of the RRAM is "1". Provided that the high resistance state suffers from degradation, that is, a resistance value of the high resistance state decreases greatly, then at this time the bit-line current IBL corresponding to the high resistance state increases accordingly, and if the reference current Iref still remains unchanged, then it is easy to turn out to be IBL>Iref when the data readout circuit determines the relationship between the size of the bit-line current IBL and that of a reference current Iref, so that the output of the data readout circuit of the RRAM is "1", resulting in data readout errors when the RRAM 300 is in the high resistance state. The degradation of high resistance state occurring to the RRAM 300 will cause a resistive random access memory window of the RRAM 300 to become smaller, which will easily lead to an increase of error rate of data readout. Therefore, in the data readout circuit of the RRAM provided by the embodiment of the present disclosure, the reference current generator 200 may generate a basic reference current I1, and the adaptive CSA 100 receives the bit-line current IBL of the RRAM 300 via an electrical connection with the RRAM 300. The adaptive CSA 100 may determine whether the bit-line current IBL of the RRAM 300 currently being read has shifted. For example, in the case that the high resistance state of the RRAM 300 degrades, that is, the resistance value of the high resistance state reduces dramatically, and thus the bit-line current IBL corresponding to the high resistance state increases accordingly, then the adaptive CSA 100 can adjust the corresponding reference current Iref based on the size of the bit-line current IBL. The size of the reference current Iref is adjusted on the basis of the basic reference current I1, for example, Reference Current Iref=Adjustment Coefficient×Basic Reference Current I1. The adjustment coefficient may be preset, which is not a specific limitation to the present disclosure. Exemplarily, in the case that the resistance state is unchanged, if the bit-line current IBL becomes larger, then the reference current Iref may be adjusted to become larger accordingly, and if the bit-line current IBL becomes smaller, then the reference current Iref can be adjusted to become smaller accordingly. By dynamically adjusting the size of the reference current Iref, it is possible to ensure that the reference current Iref is always in the middle of the bit-line current IBL output in the high resistance state and that output in the low resistance state, so as to enable to correctly read out the stored data even if the degradation of high resistance state occurs in the RRAM 300.

In the data readout circuit of the RRAM provided by the embodiment of the present disclosure, the adaptive CSA 100 and the reference current generator 200 are provided. The reference current generator 200 may generate the basic reference current I1, and the adaptive CSA may adapt the corresponding reference current Iref according to the size of the bit-line current IBL. The reference current Iref and the basic reference current I1 have a linear coefficient relationship. By dynamically adjusting the size of the reference current Iref, it may be guaranteed that the reference current Iref is always in the middle of the bit-line current output in the high resistance state and that output in the low resistance state, so that the stored data can still be correctly read out even in the case that the degradation of high resistance state occurs to the RRAM. In this way, it is possible to improve accuracy of determining the size of the bit-line current IBL and that of the reference current Iref, and to avoid the problem of data readout error due to becoming smaller of the resistive random access memory window caused by the degradation of resistance state of the RRAM 300.

Figure 2:
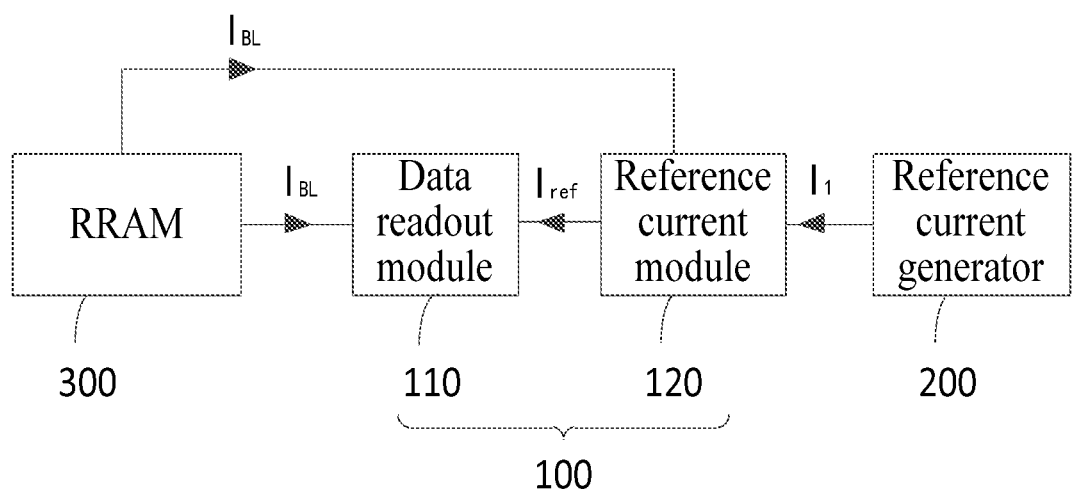
FIG. 2 is a schematic block diagram of a structure of a data readout circuit of the RRAM according to an embodiment of the present disclosure.

In some embodiment implementations, FIG. 2 is a schematic block diagram of a structure of a data readout circuit of the RRAM according to an embodiment of the present disclosure. Exemplarily as shown in FIG. 2, the adaptive CSA 100 includes: a data readout module 110 and a reference current module 120. The data readout module 110 is electrically connected to the reference current module 120, and the data readout module 110 is configured to electrically connect to the RRAM 300. The reference current module 120 is electrically connected to the RRAM 300 and the reference current generator 200, respectively. The reference current module 120 is configured to obtain the reference current according to the basic reference current and the bit-line current. The data readout module 110 is configured to compare the size of the reference current and that of the bit-line current to read out the stored data.

Exemplarily, with reference to FIG. 2, the reference current module 120 may determine whether the present reference current Iref needs to be adjusted according to the bit-line current IBL. When it is determined that the present reference current Iref needs to be adjusted, a corresponding reference current Iref may be obtained based on the basic reference current I1, and thus adjustment of the present reference current Iref is realized. The data readout module 110 may be used to compare the size of the bit-line current IBL and that of the adjusted reference current Iref to read out the stored data.

In the data readout circuit of the RRAM provided by the embodiment of the present disclosure, the data readout module 110 and the reference current module 120 are provided in the adaptive CSA 100. The reference current module 120 may adjust the present reference current Iref based on the basic reference current I1 and the bit-line current IBL. The data readout module 110 may compare the size of the reference current Iref and that of the bit-line current IBL to read out the stored data. In this way, it is possible to improve accuracy of determining of the size of the bit-line current IBL and that of the reference current Iref, and to avoid the problem of data readout error due to becoming smaller of the resistive random access memory window caused by the degradation of the resistance states of the RRAM 300.

Figure 3:
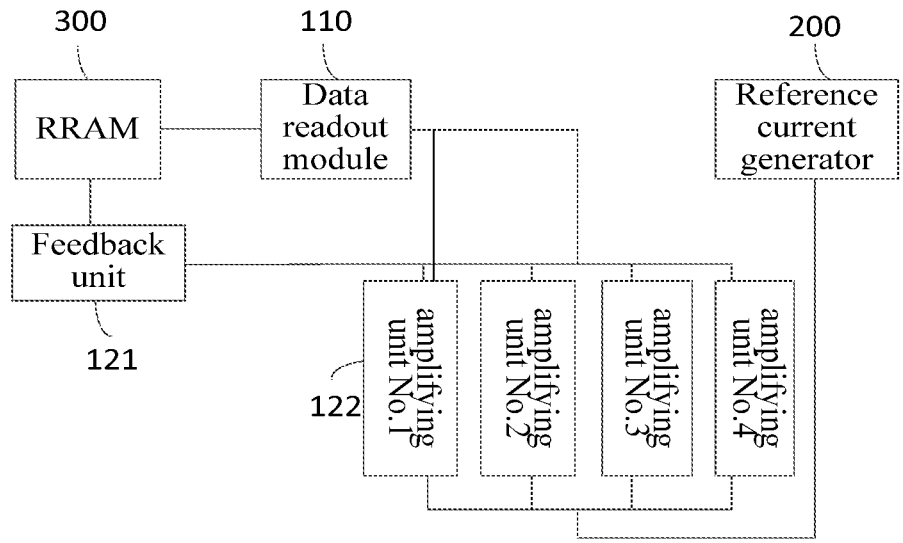
FIG. 3 is a schematic block diagram of a structure of a data readout circuit of the RRAM according to an embodiment of the present disclosure.

In some embodiment implementations, FIG. 3 is a schematic block diagram of a structure of a data readout circuit of the RRAM according to an embodiment of the present disclosure. Exemplarily, as shown in FIG. 3, the reference current module 120 includes a feedback unit 121 and a plurality of amplifying units 122. The feedback unit 121 is electrically connected to the RRAM 300 and the amplifying units 122, respectively. The amplifying units 122 are electrically connected to the data readout module 110 and the reference current generator 200, respectively. The feedback unit 121 is configured to generate an challenge response according to the bit-line current of the RRAM 300, and control conduction of a corresponding amplifying unit according to the challenge response. The amplifying units 122 are configured to amplify the basic reference current to obtain the corresponding reference current.

In some embodiment implementations, the plurality of amplifying units 122 are connected in parallel and each amplifying unit 122 corresponds to an amplification factor. The amplification factor may correspond to the Adjustment Coefficient as mentioned in the above embodiment.

Exemplarily, continually referring to FIG. 3, the number of the amplifying units 122 shown in FIG. 3 is four, which are, respectively, amplifying unit No. 1, amplifying unit No. 2, amplifying unit No. 3 and amplifying unit No. 4, these are only for schematic purpose and not intended to be a specific limitation to the present disclosure. The feedback unit 121 may generate the challenge response from the bit-line current IBL of the RRAM 300, and may control according to the challenge response which amplifying unit 122 will be specifically electrically conducted. Exemplarily as shown in FIG. 3, if the number of amplifying units 122 is four, then the challenge response may be a 4-bit code, for example, [1000], [0100], [0010] and [0001]. The challenge response [1000] may indicate that the amplifying unit No. 1 is on, and none of the other amplifying units are on; the challenge response [0100] may indicate that the amplifying unit No. 2 is on, and none of the other amplifying units are on; the challenge response may indicate that the amplifying unit No. 3 is on, and none of the other amplifying units are on; and the challenge response [0001] may indicate that the amplifying unit No. 4 is on, and none of the other amplifying units are on. The amplifying units 122 may amplify the basic reference current I1 to obtain a corresponding reference current. Exemplarily, each amplifying unit 122 corresponds to an amplification factor, and the amplification factor may be any value greater than 0, for example, 0.5, 0.8, 1.2, 1.5, 2, 3, 4 or 5, etc., which are not any specific limitation to the present disclosure. A corresponding reference current Iref may be obtained by multiplying the basic reference current I1 by an amplification factor corresponding to any amplifying unit 122, that is, the conduction of each amplifying unit 122 corresponds to a different reference current Iref. The amplifying unit 122 which is controlled to be on will provide its corresponding reference current Iref to the data readout module 110.

In the data readout circuit of the RRAM provided by the embodiment of the present disclosure, the feedback unit 121 is disposed to generate the challenge response according to the bit-line current IBL, and to control according to the challenge response which amplifying unit 122 is on. The plurality of amplifying units 122 are connected in parallel, and each amplifying unit 122 corresponds to an amplification factor. Adjustment of the current reference current Iref may be implemented by means of controlling conduction of the corresponding amplifying unit through the challenge response by the feedback unit 121 and by means of amplifying factor of the basic reference current I1 through the conduction of the amplifying unit 122. In this way, it is possible to improve the accuracy of determining the size of the bit-line current IBL and that of the reference current Iref, and to avoid the problem of data readout error due to the resistive random access memory window becoming smaller, which is caused by the degradation of resistance states of the RRAM 300

Figure 4:
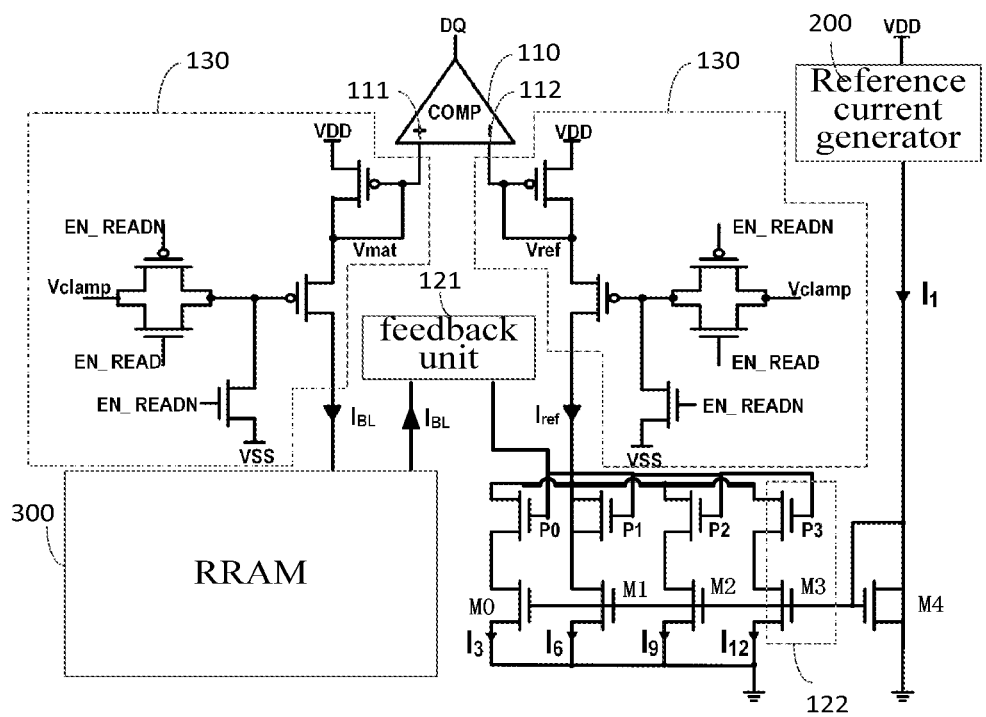
FIG. 4 is a schematic diagram of a structure of a data readout circuit of the RRAM according to an embodiment of the present disclosure.

In some embodiment implementations, FIG. 4 is a schematic diagram of a structure of a data readout circuit of the RRAM according to an embodiment of the present disclosure. Exemplarily, as shown in FIG. 4, an amplifying unit 122 includes a first MOS transistor, a gate of which is electrically connected to the feedback unit 121. The number of the amplifying units 122 shown in FIG. 4 is four, and the first MOS transistors corresponding to the four amplifying units 122 are, respectively, a first MOS transistor P0, a first MOS transistor P1, a first MOS transistor P2, and a first MOS transistor P3. A gate of each first MOS transistor is electrically connected to the feedback unit 121. Turn-on of the first MOS transistors may control the conduction of the corresponding amplifying units 122, and turn-off of the first MOS transistors may control disconnection of the corresponding amplifying units 122. The feedback unit 121 may apply an electrical signal to the gate of the first MOS transistor according to the challenge response to turn on the first MOS transistor so as to control the conduction of the corresponding amplifying unit 122. It is possible to achieve the control of the turn-on and turn-off in a more sensitive manner by using of the MOS transistors, which may be carried out through pulse signals or other electrical signals, in this way it makes the control easy and will not cause an increase of readout delay of the circuit.

In some embodiment implementations, continually referring to FIG. 4, the amplifying unit 122 further includes a second MOS transistor, and the second MOS transistors corresponding to the amplifying units shown in FIG. 4 are, respectively, a second MOS transistor M0, a second MOS transistor M1, a second MOS transistor M2, and a second MOS transistor M3. A third MOS transistor M4 is disposed between the second MOS transistors and the reference current generator 200. A width-to-length ratio of the channel of the third MOS transistor M4 multiplied by an amplification factor is equal to a width-to-length ratio of the channel of the corresponding second MOS transistor, that is, the width-to-length ratio of the channel of the second MOS transistor divided by the channel width-to-length ratio of the third MOS transistor M4 is equal to the amplification factor of the corresponding amplification unit 122. A source and a gate of the third MOS transistor M4 are connected in short-circuit so that the third MOS transistor M4 is in a saturation mode, and a current flowing through the third MOS transistor M4 is always the basic reference current I1. Amplification of the basic reference current I1 is implemented by connecting the gates of the second MOS transistors and the gate of the third MOS transistor M4 in series and by designing the MOS transistors with various width-to-length ratios of the channel. Exemplarily, if the width-to-length ratio of the channel of the third MOS transistor M4 is 1 and the width-to-length ratios of the channels of the second MOS transistors M0, M1, M2 and M3 are 3, 6, 9 and 12, respectively, then corresponding currents flowing through the second MOS transistors M0, M1, M2 and M3 are I3=3I1, I6=6I1, I9=9I1 and I12=12I1, respectively. Therefore, it is possible to achieve amplification of the basic reference current I1 so as to obtain the corresponding reference current Iref. Iref=I3 when the second MOS transistor M0 is on; Iref=I6 when the second MOS transistor M1 is on; Iref=I9 when the second MOS transistor M2 is on; and Iref=I12 when the second MOS transistor M3 is on. Therefore, it is easy to implement amplification of current with higher accuracy by designing the second MOS transistors with various channel sizes (width-to-length ratios). The channel sizes of the MOS transistors provided in this embodiment are only for illustrative purpose, and are not intended to be a specific limitation to the present disclosure.

Continually referring to FIG. 4, the adaptive CSA 100 includes a pre-protection module 130. The data readout module 110 includes a bit-line current input terminal 111, a reference current input terminal 112, and a data readout terminal DQ. The bit-line current input terminal 111 and the reference current input terminal 112 are electrically connected to the pre-protection module 130, respectively. The data readout module 110 shown in FIG. 4 may use a comparator COMP, and two input terminals of the comparator COMP are respectively used as the bit-line current input terminal 111 and the reference current input terminal 112, and an output terminal of the comparator COMP is used as the data readout terminal DQ. The pre-protection module 130 may play the role of current limiting protection. Specifically, a current flowing through the pre-protection module 130 is controlled not to be too large by controlling voltages Vmat and Vref, respectively, so as to prevent the comparator COMP from being damaged by the overcurrent. In FIG. 4, two pre-protection modules 130 are arranged symmetrically with respect to the comparator COMP, and of the two pre-protection modules 130 have same circuit structures, so that current-limiting protection can be provided for the both input terminals of the comparator COMP. As shown in FIG. 4, VDD may represent a high level, and VSS may represent a low level; EN_READN and EN_READ may represent turn-on enable signal terminals of the MOS transistors respectively, and Vclamp may represent a voltage input terminal of a clamping circuit. The pre-protection module 130 includes NMOS and PMOS, and the circuit structure of the pre-protection module 130 as shown in FIG. 4 is only for schematic purpose and is not intended to be a specific limitation to the present disclosure. The reference current Iref is input to the reference current input terminal 112 via the pre-protection module 130, and the bit-line current IBL is input to the bit-line current input terminal 111 via the pre-protection module 130.

Figure 5:
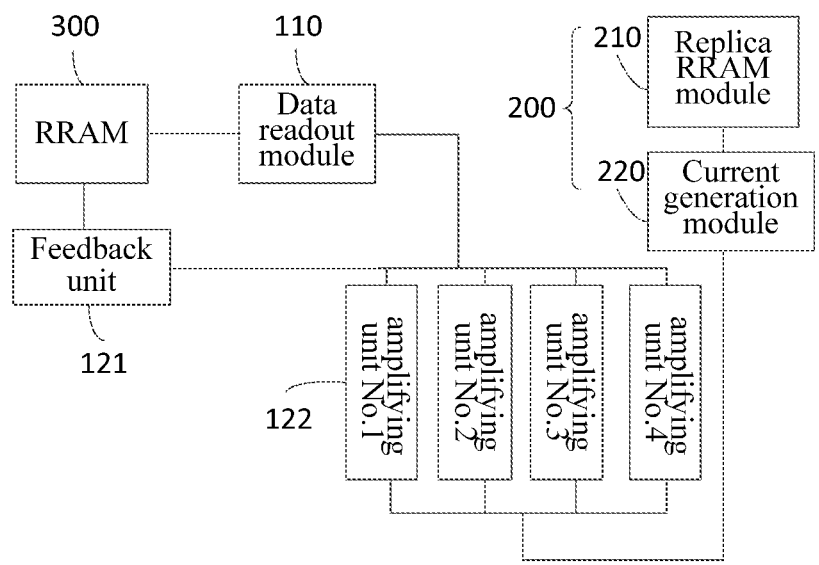
FIG. 5 is a schematic block diagram of a structure of a data readout circuit of the RRAM according to an embodiment of the present disclosure.

In some embodiment implementations, FIG. 5 is a schematic diagram of a structure of a data readout circuit of the RRAM according to an embodiment of the present disclosure. Exemplarily, as shown in FIG. 5, the reference current generator 200 includes a replica resistive random access memory module (replica RRAM module) 210 and a current generation module 220. The current generation module 220 is configured to generate a basic reference current I1 when the replica RRAM module 210 is in a low resistance state, wherein, the current when the replica RRAM module is in the low resistance state is a low resistance current which is twice the basic reference current.

Figure 6:
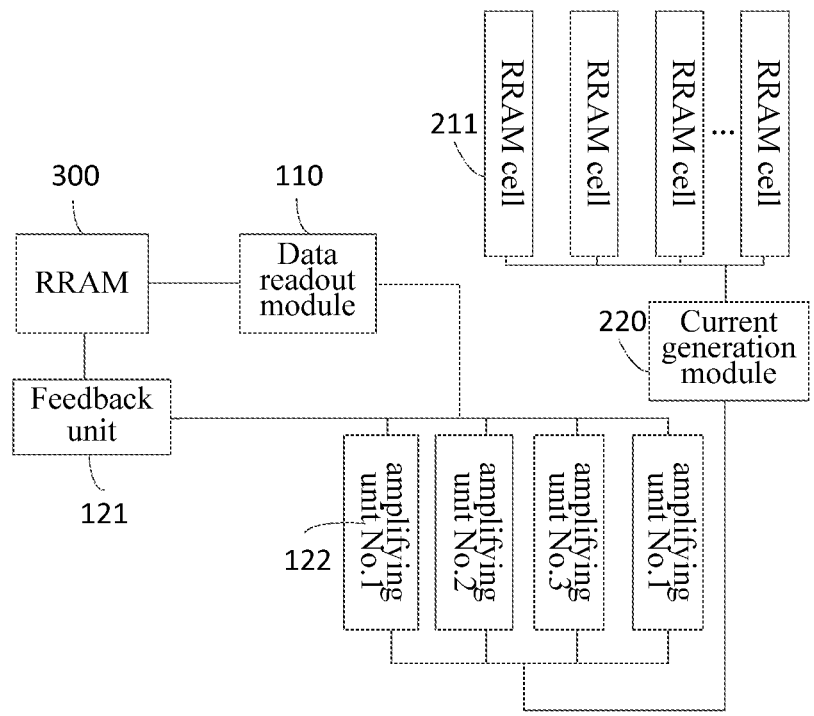
FIG. 6 is a schematic diagram of a structure of a data readout circuit of the RRAM according to an embodiment of the present disclosure.

In some embodiment implementations, FIG. 6 is a schematic diagram of a structure of a data readout circuit of the RRAM according to an embodiment of the present disclosure. Exemplarily, as shown in FIG. 6, the replica RRAM module 210 includes a plurality of resistive random access memory cells (RRAM cells) 211, and the plurality of RRAM cells 211 may be arranged in an array, which is not a specific limitation to the present disclosure. The current generation module 220 generates the basic reference current I1 when all the RRAM cells 211 are in the low resistance state, wherein the current when the replica RRAM module 210 is in the low resistance state is a low resistance current I0 which is twice the basic reference current I1, and the current generation module 220 generates the basic reference current I1 by taking the low resistance state of the RRAM cells 211 as a reference standard, that is, the current generation module 220 halves the low resistance current I0 to obtain the basic reference current I1. The low resistance current I0 obtained through the replica RRAM module 210 simulates the maximum current of the RRAM. Half of the low resistance current I0 is used as the basic reference current I1, and subsequently the obtained basic reference current I1 is adjusted to amplify to different extents so that the reference current Iref may always be kept in the middle of the bit-line current of a low resistance state and the bit-line current of a high resistance state. The bit-line current of the low resistance state is the bit-line current when the RRAM 300 is in the low resistance state, and the bit-line current of the high resistance state is the bit-line current when the RRAM 300 is in the high resistance state. In this way, the bit-line current of the high resistance state can always be less than the reference current, and the bit-line current of the low resistance state can always be greater than the reference current, and thus it can be carried out that an output of the data readout circuit of the RRAM is "0" when the RRAM 300 is in the high resistance state, and the output of the data readout of the RRAM is "1" when the RRAM 300 is in the low resistance state. Therefore, it is possible to improve the accuracy of determining the size of the bit-line current IBL and the size of the reference current Iref, and to avoid the problem that the RRAM window becomes smaller due to degradation of the resistance states of the RRAM 300, and thus to avoid data readout errors. The replica RRAM module 210 may be obtained directly by copying the RRAM cell in the RRAM 300, which is not a specific limitation to the present disclosure.

Figure 7:
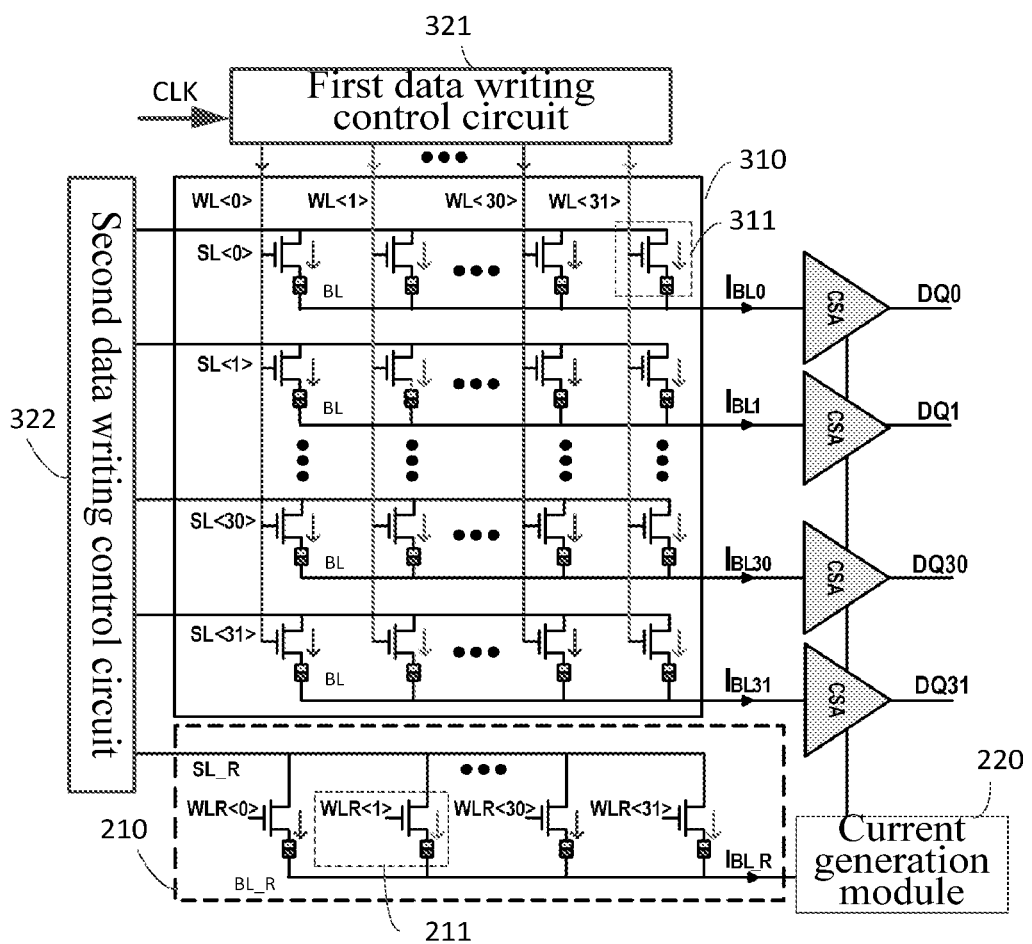
FIG. 7 is a schematic block diagram of a structure of a RRAM circuit according to an embodiment of the present disclosure.

In a second aspect of the present disclosure, a RRAM circuit is provided. FIG. 7 is a schematic block diagram of a structure of a RRAM circuit according to an embodiment of the present disclosure. Exemplarily, as shown in FIG. 7, the embodiment of the present disclosure provides a RRAM circuit, including: a RRAM and the data readout circuit of the RRAM as described in the first aspect of the present disclosure. The RRAM includes a resistive random access memory array (RRAM array) 310 and a data writing control circuit. The RRAM array 310 is electrically connected to the data writing control circuit; and the RRAM array 310 is electrically connected to the adaptive CSAs in the data readout circuit of the RRAM. The RRAM array 310 includes a plurality of RRAM cells 311 which are arranged in an array.

Exemplarily, as shown in FIG. 7, the RRAM cells 311 use the structure of 1T1R, that is, each RRAM cell 311 includes one MOS transistor and one resistor. The RRAM cells 311 in a row connected in series are electrically connected to one adaptive CSA of the data readout circuit of the RRAM. The replica RRAM module 210 is electrically connected to a data writing control circuit and the current generation module 220, respectively. The data writing control circuit includes a first data writing control circuit 321 and a second data writing control circuit 322.

The RRAM cells 311 conduct electricity through oxygen vacancies in the resistive switching layer. When gaps among the oxygen vacancies change, the electrical conductivity of the RRAM cells changes accordingly, and such changes can be reflected in changes of current or resistance. When writing operation is executed to the RRAM array 310, it turns out to enable the RRAM cells 311 which are correspondingly written to form conductive paths (this process may be referred as "FORM"), otherwise the RRAM cells 311 would be in an insulation state. During the operation, a relative larger level difference needs to be formed across the two ends of the RRAM cell 311. At this time, a suitable voltage is applied to a word line (WL) so as to make the MOS transistor be in a saturation state, which can play the role of current limiting to prevent the RRAM cell 311s from being damaged by the overcurrent; and a larger voltage is applied to a bit-line (BL) and a source line (SL) is connected to ground to activate the oxygen vacancies in the resistive switching layer, so as to enable the formation of the conductive paths under an electric field, and the RRAM cell 311 is changed to a low resistance state (LRS). A process of the RRAM cell 311 returning back to a high resistance state (HRS) and enabling the rupture of the conductive paths of the RRAM cell 311 is referred as "RESET", which is opposite to the "FORM" process, and in this process a reverse voltage needs to be applied to the RRAM cell 311 so as to enable the rupture of conductive filaments. Specifically, a voltage is applied to the word line WL to make the MOS transistor be in a linear state (in which the resistance increases and there is no need for current limiting), the bit-line BL is connected to ground, and a voltage is applied to the source line SL, so as to enable the RRAM cells 311 to change from the low resistance state to the high resistance state. This process is a process of erasing data or writing "0" (referred as RESET). A "SET" process is similar to the "FORM" process, but the RRAM cells 311 in the "FORM" process may form the conductive paths without a very large bit-line voltage. It is easy to understand that a process of changing from the high resistance state to the low resistance state is a process of writing "1". During the process of erasing and writing using the RRAM cells 311, the conductive paths will form and rupture in a random manner, and there are nano-scale gaps among the oxygen vacancies that constitute the conductive paths. Unpredictability of size of the gaps and random distribution of the oxygen vacancies lead to changes of the conductive paths in shape and size, which result in the changes of resistance values between the RRAM cells 311. Such changes can be extracted as a response of Physical Unclonable Function (PUF). After the plurality of RRAM cells 311 are subjected to the "FORM" process, and then through a initialization key generation process of PUF in the "SET" and "RESET" processes, a suitable reference current is selected, and the adaptive CSAs of the data readout circuit of the RRAM can read out the stored data (0 or 1) by comparing the reference current and the bit-line current, and the obtained stored data can be used as a key of the PUF.

Exemplarily, as shown in FIG. 7, the first data writing control circuit 321 is configured to control the application of a voltage to a word line WL according to a clock signal CLK, and the second data writing control circuit 322 is configured to control whether the source line SL and the bit-line BL are connected to ground or a voltage. Generally, the gate of the MOS transistor corresponds to the word line WL, the source of the MOS transistor corresponds to the source line SL, and the drain of the MOS transistor corresponds to the bit-line BL. Exemplarily, as shown in FIG. 7, the RRAM cells 311 in the same column correspond to a same word line (WL) signal, and the word line signals of the RRAM array 310 are WL<0>, WL<1>, . . . , WL<30>, WL<31>(32 bits), respectively; the RRAM cells 311 in the same row correspond to a same source line (SL) signal, and the source line signals of the RRAM array 310 are SL<0>, SL<1>, . . . , SL<30>, SL<31>(32 bits), respectively; the RRAM cells 311 in the same row correspond to a same bit-line (BL) current, and the bit-line currents of the RRAM array 310 are IBL0, IBL1, . . . , IBL30, IBL31 (32 bits), respectively; and the corresponding read-out stored data are DQ0, DQ1, . . . , DQ30, DQ31 (32 bits), respectively. The word line of the replica RRAM module 210 is WLR (WLR<0>, WLR<1>, . . . , WLR<30>, WLR<31>), the source line thereof is SL_R, the bit-line thereof is BL_R, and the bit-line current is IBL_R, and the basic reference current I1 is generated based on the bit-line current IBL_R. As shown in FIG. 7, the RRAM cells 311 of 32 rows×32 columns in the RRAM array 310 are only for schematic purpose, and are not intended to be a specific limitation to the present disclosure.

The RRAM circuit provided by embodiments of the present disclosure aims to solve the problem of a readout error of the stored data that is resulted from the fact that the readout circuit of the RRAM cannot recognize properly the low resistance state and the high resistance state due to a decrease in the size of RRAM window caused by degradation of high resistance state of the RRAM cells. In the RRAM circuit provided by embodiments of the present disclosure, the adaptive CSAs in the data readout circuit of the RRAM are provided, and the basic reference current I1 is generated by use of the replica RRAM module 210 and the current generation module 220, and the adaptive CSAs 100 obtain an adaptively adjusted reference current Iref based on the bit-line current IBL and the basic reference current I1. When the bit-line current IBL changes due to the degradation of high resistance state, the effect of adjusting the reference current Iref is achieved by correspondingly amplifying the basic reference current I1, so as to remedy the problem caused by the decrease in the size of RRAM window by synchronously and adaptively adjusting the reference current Iref which is compared with the bit-line current IBL. In this way, it is possible to improve the accuracy in determining the size of the bit-line current IBL and the size of the reference current Iref, and thus to avoid the occurrence of the problem of data readout errors, and to enable the correct readout of the stored data despite the degradation of high resistance state occurring in the RRAM cells.

While the preferred embodiments of the present specification have been described, additional changes and modifications to these embodiments may be made once the basic inventive concepts are known by those skilled in the art. Therefore, the appended claims are intended to be construed to include the preferred embodiments and all changes and modifications that fall within the scope of the specification.

Apparently, a person skilled in the art may make various modifications and variations to the specification without departing from the spirit and scope of this specification. Thus, it is intended that the present specification cover modifications and variations of this specification provided they fall within the scope of the following claims, the specification and their equivalents.

What is claimed is:

1. A data readout circuit of a resistive random access memory (RRAM), comprising: an adaptive current sense amplifier (CSA) and a reference current generator,
wherein the adaptive CSA is configured to electrically connect to the RRAM, and the adaptive CSA is electrically connected to the reference current generator;
the reference current generator is configured to generate a basic reference current;
the adaptive CSA is configured to obtain a reference current based on the basic reference current and a bit-line current of the RRAM; and
the adaptive CSA is configured to compare a size of the reference current and that of the bit-line current so as to read out data stored in the RRAM;
wherein the adaptive CSA comprises a data readout module and a reference current module;
the data readout module is electrically connected to the reference current module, and the data readout module is configured to electrically connect to the RRAM, and the reference current module is electrically connected to the RRAM and the reference current generator respectively;
the reference current module is configured to obtain the reference current based on the basic reference current and the bit-line current; and
the data readout module is configured to compare the size of the reference current and that of the bit-line current, so as to read out the stored data.

2. The data readout circuit of the RRAM according to claim 1, wherein the reference current module comprises a feedback unit and a plurality of amplifying units;
the feedback unit is electrically connected to the RRAM and the amplifying units respectively, and each of the amplifying units is electrically connected to the data readout module and the reference current generator respectively;
the feedback unit is configured to generate an challenge response according to the bit-line current of the RRAM, and control conduction of a corresponding amplifying unit according to the challenge response; and
the amplifying unit is configured to amplify the basic reference current to obtain a corresponding reference current.

3. The data readout circuit of the RRAM according to claim 2, wherein the plurality of amplifying units are connected in parallel, and each of the amplifying units has a corresponding amplification factor.

4. The data readout circuit of the RRAM according to claim 3, wherein each of the amplifying units includes a first MOS transistor, and a gate of the first MOS transistor is electrically connected to the feedback unit.

5. The data readout circuit of the RRAM according to claim 3, wherein each of the amplifying units includes a second MOS transistor, and a third MOS transistor is disposed between the second MOS transistor and the reference current generator;
- a width-to-length ratio of a channel of the third MOS transistor multiplied by the amplification factor is equal to a width-to-length ratio of a channel of a corresponding second MOS transistor.

6. The data readout circuit of the RRAM according to claim 1, wherein the adaptive CSA includes a pre-protection module;
- the data readout module includes a bit-line current input terminal, a reference current input terminal and a data readout terminal; and
- the bit-line current input terminal and the reference current input terminal are respectively electrically connected to the pre-protection module.

7. The data readout circuit of the RRAM according to claim 1, wherein the reference current generator includes a replica resistive random access memory module and a current generation module;
- the current generation module is configured to generate the basic reference current when the replica resistive random access memory module is in a low resistance state, wherein a current when the replica resistive random access memory module is in the low resistance state is a low resistance current which is twice the basic reference current.

8. The data readout circuit of the RRAM according to claim 7, wherein the replica resistive random access memory module includes a plurality of resistive random access memory cells.

9. A resistive random access memory circuit, comprising: a RRAM and the data readout circuit of the RRAM according to claim 1;
- the RRAM includes a resistive random access memory array and a data writing control circuit, and the resistive random access memory array is electrically connected to the data writing control circuit;
- the resistive random access memory array is electrically connected to the data readout circuit of the RRAM; and
- the resistive random access memory array includes a plurality of resistive random access memory cells.

* * * * *